(12) United States Patent
Hu et al.

(10) Patent No.: US 8,103,468 B2
(45) Date of Patent: Jan. 24, 2012

(54) METHODS AND DEVICES FOR EVALUATING THE OPERATING CHARACTERISTICS OF A DBR LASER DIODE

(75) Inventors: Martin Hai Hu, Painted Post, NY (US); Hong Ky Nguyen, Painted Post, NY (US); Paul Willard Smith, Exeter Township, PA (US)

(73) Assignee: Corning Incorporated, Corning, NY (US)

( * ) Notice: Subject to any disclaimer, the term of this patent is extended or adjusted under 35 U.S.C. 154(b) by 416 days.

(21) Appl. No.: 12/414,940

(22) Filed: Mar. 31, 2009

(65) Prior Publication Data

US 2010/0250166 A1    Sep. 30, 2010

(51) Int. Cl.
*G06F 11/26* (2006.01)
*G02F 1/00* (2006.01)

(52) U.S. Cl. .................. 702/64; 702/65; 372/50.11

(58) Field of Classification Search .................. 702/64, 702/65, 117, 124
See application file for complete search history.

(56) References Cited

U.S. PATENT DOCUMENTS

| 5,541,945 | A * | 7/1996 | Yamaguchi et al. | 372/20 |
| 6,185,230 | B1 * | 2/2001 | Waarts | 372/6 |
| 7,420,997 | B2 * | 9/2008 | Bhatia et al. | 372/38.07 |
| 2004/0032884 | A1 * | 2/2004 | Kitaoka et al. | 372/20 |
| 2004/0174915 | A1 | 9/2004 | Sarlet et al. | |

FOREIGN PATENT DOCUMENTS

| WO | 99/40654 | 8/1999 |
| WO | 2004/021533 | 3/2004 |
| WO | 2004/040722 | 5/2004 |

OTHER PUBLICATIONS

C.H. Henry, et al., "Theory of spontaneous emission noise in open resonators and its application to lasers and optical amplifiers" J. Lightwave Tech., V. 4, No. 3, 288-97, 1985.

(Continued)

*Primary Examiner* — Hal Wachsman
(74) *Attorney, Agent, or Firm* — Joseph M. Homa

(57) ABSTRACT

In accordance with one embodiment of the present disclosure, a method of evaluating the operating characteristics of a Distributed Bragg Reflector (DBR) laser diode is provided. According to the method, a diagnostic electrical current is injected into the wavelength tuning section of the DBR laser to generate amplified spontaneous emission of light in the wavelength tuning section. Light emitted from the wavelength tuning section is absorbed by the gain section and photo current generated by the light absorbed in the gain section is measured. The photo current measured in the gain section can be correlated with an evaluation of the operating characteristics of the DBR laser diode. For example, the measured photo current can be correlated with a substandard operating characteristic when it departs from a given photo current metric by more than an acceptable amount. Additional embodiments are disclosed and claimed.

11 Claims, 2 Drawing Sheets

OTHER PUBLICATIONS

M. H. Hu, "High-power Distributed Bragg Reflector Lasers for Green-light Generation", Photonics West Conference, paper 6116-22, San Jose, CA, 2006.

J. Arias et al., "Analysis of degradation mechanisms in high power AlTaAs 808 nm laser bars" IEEE, 1997.

R. W. Dixon et al., Accelerated aging and a uniform mode of degradation in (Al,Ga) As double-heterostructure lasers, Journal of Applied Physics, vol. 48, No. 8, p. 3225-3226, Aug. 1977.

L. Marona et al., "Degradation mechanisms in InGaN laser diodes grown on bulk GaN crystals", American Institute of Physics Letters 88, 201111 (2006).

Delorme et al., "Long-Term Wavelength Stability of 1.55-µm Tunable Distributed Bragg Reflector Lasers", IEEE Journal of Selected Topics in Quantum Electronics, vol. 5, No. 3, 1999.

Ackerman et al., "Assessment and Modeling of Aging in Electro-Absorption Distributed Bragg Reflector Lasers", IEEE Journal of Quantum Electronics, vol. 37, No. 11, 2001.

L. Coldren and S. Corzine, Eds. Diode Lasers and Photonic Integrated Circuits, New York: Wiley, 1995, pp. 41-45.

M. Fukuda, "Reliability and degradation of semiconductor lasers and LEDs", Artech House Inc., 1991, pp. 56, 231-232.

* cited by examiner

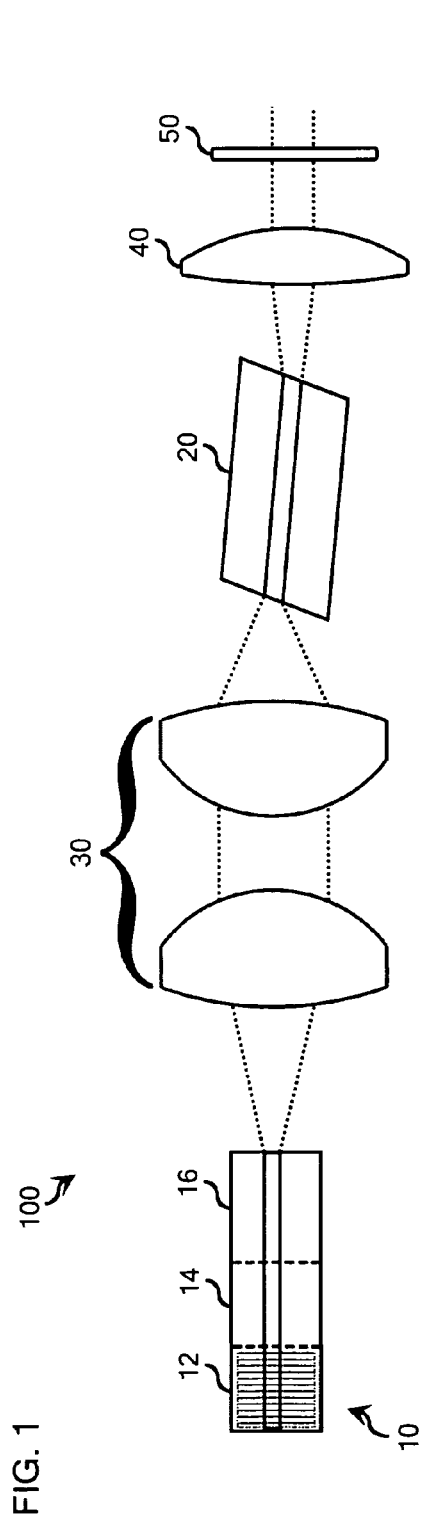
FIG. 1
FIG. 2
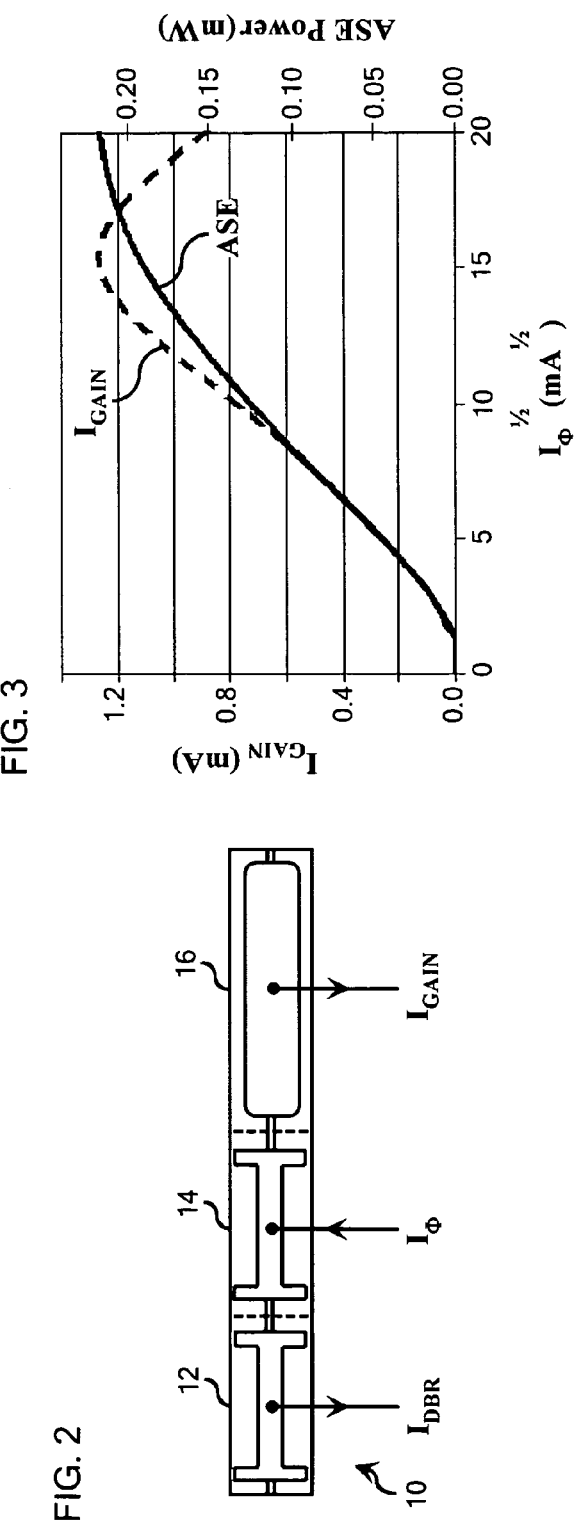
FIG. 3

METHODS AND DEVICES FOR EVALUATING THE OPERATING CHARACTERISTICS OF A DBR LASER DIODE

BACKGROUND

The present disclosure relates to the testing and characterization of laser diodes, including laser diodes for use in frequency-converted laser sources.

BRIEF SUMMARY

Although the various concepts of the present disclosure are not limited to lasers that operate in any particular part of the optical spectrum or in any particular type of device, reference is frequently made herein to frequency doubled green lasers utilizing an Infrared Distributed Bragg Reflector (IR DBR) laser diode optical pump, such as, for example, the frequency-doubled laser source illustrated in FIG. 1. In FIG. 1, a frequency-converted laser source 100 is illustrated and comprises an IR DBR laser diode 10, a wavelength conversion device 20, e.g., a periodically poled lithium niobate (PPLN) SHG crystal, coupling optics 30, collimating optics 40, and an optical color filter 50. As will be appreciated by those familiar with laser design, the DBR laser diode 10 typically comprises a DBR section 12 including a Bragg reflector, a phase control section 14, and a gain section 16.

Although the present disclosure discusses the particular case where the laser source 100 comprises an DBR laser diode 10 operating in the IR range and a frequency-doubling PPLN crystal 20, it is noted that the concepts of the present disclosure are equally applicable to a variety of frequency-converted laser configurations including, but not limited to, configurations with laser diode operating outside of the IR range and frequency conversion beyond second harmonic generation (SHG). The concepts of the present disclosure are also applicable to a variety of laser projection applications including, but not limited to, laser scanning projectors.

The present inventors have recognized that laser degradation is a particularly acute issue in frequency-doubled laser sources because wavelength conversion efficiency is usually strongly dependent on proper wavelength matching between the IR laser diode and the conversion bandwidth of the wavelength conversion device—typically a periodically poled lithium niobate (PPLN) SHG crystal. If the wavelength of the IR laser diode deviates from the phase matching wavelength of the wavelength conversion device, the output power of the frequency-doubled light drops drastically. Therefore, it is typically very important to be able to control the wavelength of the IR laser.

The emission wavelength of a DBR laser can be controlled by injecting current into one of the wavelength tuning sections of the laser, i.e., either the DBR section, the phase control section, or both. For the case of current injected into the DBR section, the Bragg resonant wavelength is changed and the DBR laser output wavelength can be tuned over a relatively large range. For the case of current injected into the phase section, the optical path length of the DBR laser is changed and the DBR laser output wavelength can be tuned in fine steps. Since current injection is often critical for controlling the DBR laser wavelength, it is often important to develop methods and systems for measuring the wavelength tuning characteristics associated with current injection, as part of the fabrication process of DBR lasers. For example, during "burn-in" and other types of reliability testing, currents can be injected into the DBR and/or phase sections of a large number of laser diodes and the wavelength shift of the lasers over a given period of time can be monitored and used as an indication of laser degradation. Lasers exhibiting less than a normal range of wavelength shift at a given current or unacceptable stabilization patterns can be characterized as sub-standard performers and treated accordingly.

Typically, burn-in or other types of reliability testing protocols involve the processing of a large quantity of lasers, preferably in-situ, utilizing some type of optical spectrometer for wavelength measurement. However, the use of optical spectrometers in reliability testing carries significant limitations because the size, ease of use, and efficiency of optical spectrometers are often prohibitive. In addition, it is often difficult to measure wavelength directly using an optical spectrometer because current injection in the laser diode generates thermal effects that can cancel the wavelength shift induced by the carrier effect, making it difficult to determine the carrier-induced wavelength shift. Another problem of measuring the wavelength directly using an optical spectrometer is the occurrence of wavelength mode hops that are intrinsic to many lasers, including DBR laser diodes.

Therefore, the present disclosure presents characterization and testing methodology that can be more resistant to the aforementioned thermal effects, can avoid problems associated with carrier-induced wavelength shifts, can avoid the negatively impact of wavelength mode hops, and can be easily integrated into burn-in and other reliability testing devices. More generally, the present disclosure offers laser characterization methodology that can be used to identify unacceptable degradation and can be applied to a relatively large number of devices.

In accordance with one embodiment of the present disclosure, a method of evaluating the operating characteristics of a DBR laser diode is provided. According to the method, a diagnostic electrical current is injected into the wavelength tuning section of the DBR laser to generate amplified spontaneous emission of light in the wavelength tuning section. Light emitted from the wavelength tuning section is absorbed by the gain section and photo current generated by the light absorbed in the gain section is measured. The photo current measured in the gain section can be correlated with an evaluation of the operating characteristics of the DBR laser diode. For example, the measured photo current can be correlated with a substandard operating characteristic when it departs from a given photo current metric by more than an acceptable amount. Alternatively, the measured photo current can be correlated with a certified operating characteristic when it departs from the given photo current metric by an acceptable amount.

The photo current in the gain section can be measured as a function of time and can be correlated with a certified or substandard operating characteristic by comparing the measured photo current with a given time sensitive photo current metric. Alternatively, the measured photo current can be correlated with a certified or substandard operating characteristic by comparing the measured photo current to a predetermined laser degradation threshold. As a further alternative, it is contemplated that the photo current in the gain section can be measured at a plurality of different times and can be correlated with a certified or substandard operating characteristic by comparing the measured photo current with given photo current metrics at the plurality of different times. It is further contemplated that the photo current in the gain section can be measured in-situ during burn-in testing of the laser diode or before and after burn-in testing of the laser diode.

In accordance with another embodiment of the present disclosure, it is contemplated that the photo current can be measured in the DBR section or the gain section of a DBR laser to evaluate of the operating characteristics of the DBR laser diode.

In accordance with yet another embodiment of the present disclosure, a burn-in device for evaluating the operating characteristics of a DBR laser diode is provided. Generally, the burn-in device is programmed to inject electrical currents into the DBR laser diode at levels exceeding normal operating conditions of the DBR laser diode. Further, the burn-in device can be programmed to inject a diagnostic current into the phase control section of the DBR laser, measure photo current in the DBR section or the gain section, as generated by the light absorbed therein, and correlate the photo current measured in the DBR section or the gain section with an evaluation of the operating characteristics of the DBR laser diode. The measured photo current can, for example, be correlated with a substandard operating characteristic when it departs from a given photo current metric by more than an acceptable amount and, alternatively, can be correlated with a certified operating characteristic when it departs from the given photo current metric by an acceptable amount.

In accordance with yet another embodiment of the present disclosure, a burn-in device and method of evaluating the operating characteristics of a DBR laser diode are provided where a diagnostic current is injected into the wavelength tuning section of the DBR laser and comprises a radiative component that is sufficient to generate amplified spontaneous emission of light in the wavelength tuning section and a non-radiative component that increases with laser degradation. According to the method, increases in the non-radiative component of the diagnostic current are measured by monitoring the voltage component of the diagnostic current injected into the wavelength tuning section of the DBR laser as a function of time. The monitored voltage can be used to evaluate the operating characteristics of the DBR laser diode. For example, the voltage component can be correlated with a substandard operating characteristic when it departs from a given voltage metric by more than an acceptable amount and, alternatively, can be correlated with a certified operating characteristic when it departs from the given voltage metric by an acceptable amount. For example, it is contemplated that increases in the non-radiative component of the diagnostic current can be measured by monitoring the voltage needed to maintain the diagnostic current at an approximately constant magnitude.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 1 is a schematic illustration of a frequency-converted laser source;

FIG. 2 is a schematic illustration of a DBR laser diode;

FIG. 3 is an experimental plot illustrating the relationship of total ASE power and gain-section photo current $I_{GAIN}$ versus the square-root of phase-section injection current $I_\phi$ for a common DBR laser.

DETAILED DESCRIPTION

Figure 4:
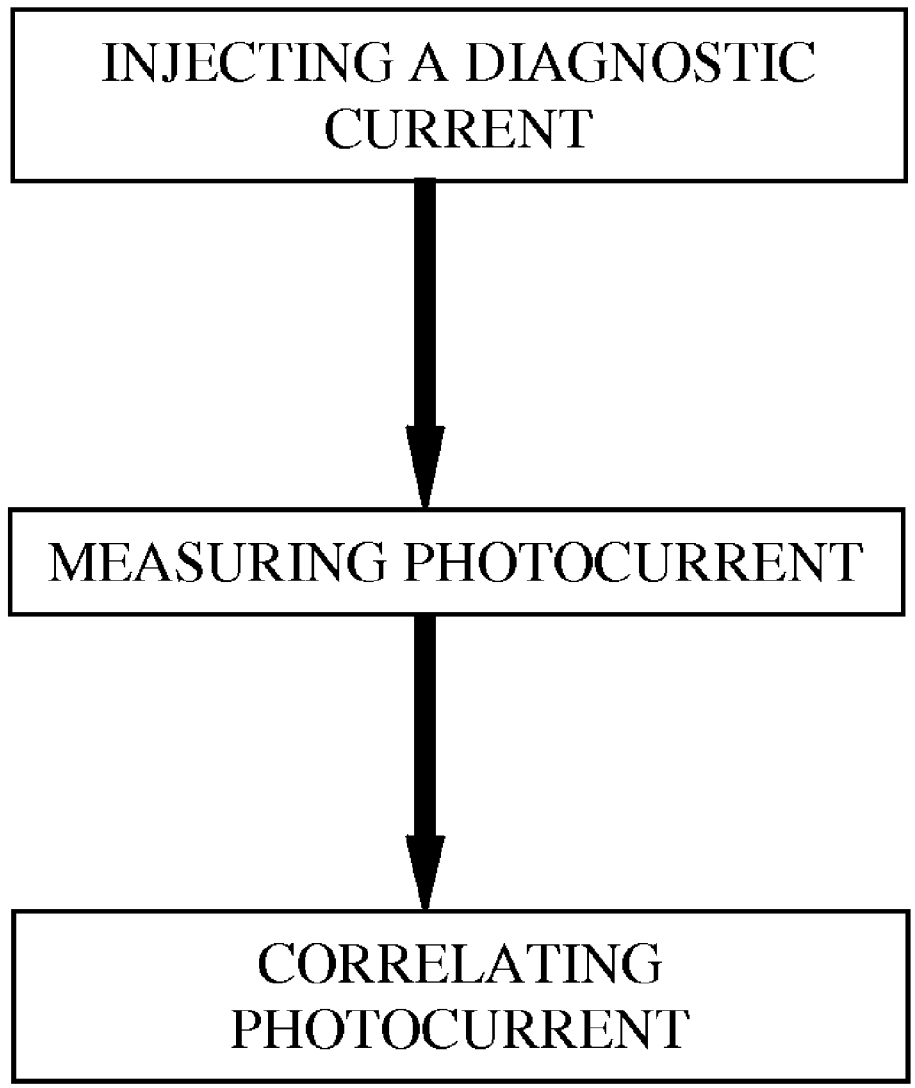
FIG. 4 is a flow chart of a method of evaluating the operating characteristics of DBR laser diode.

The emission wavelength of a DBR laser 10 can be changed by injecting electrical current into the DBR or phase control sections 12, 14 of the laser. The present inventors have recognized that the problem of measuring carrier-induced wavelength shift $\delta\lambda$ as a function of the injection current I can be viewed as the problem of measuring the carrier density N as a function of the injection current I:

$$\delta\lambda(I) \propto N(I) \quad (1)$$

The value of the optical gain g of a semiconductor laser material in $cm^{-1}$, at the peak of the gain spectrum, can be related to carrier density N as follows:

$$g \propto \ln(N/N_{tr}) \quad (2)$$

where $N_{tr}$ is the transparency carrier density. If N is less than $N_{tr}$, the optical gain g is negative which means the material is absorptive. If N is larger than $N_{tr}$, the optical gain g is positive which means the material is an optical amplifier. For practical reasons usually $N \gg N_{tr}$, and equation (2) can be simplified:

$$g \propto \ln(N) \quad (3)$$

The amplified spontaneous emission (ASE) power of a semiconductor laser material can be related to the optical gain g as follows:

$$P_{ASE} \propto e^{gL} \quad (4)$$

where $P_{ASE}$ is the ASE power at the gain peak and L is the length of the semiconductor laser material.

The following relation can be derived using equations (3) and (4):

$$\ln(P_{ASE}) \propto \ln(N) \quad (5)$$

Typically, the ASE spectrum is broad, covering a range of wavelengths instead of just being at the gain peak wavelength. However, equation (5) is still a good approximation when $P_{ASE}$ is the total ASE power, which is the ASE power integrated over all wavelengths. Accordingly, equations (1) and (5) provide a relatively simple representation of total ASE power, carrier density, and wavelength shift as functions of injection current and can be validated to show that it is possible to use the measurement of ASE power for measuring carrier density and therefore the carrier-induced wavelength shift due to current injection.

FIG. 4 shows the steps of a method of evaluating the operating characteristics of a DBR laser diode. The method may include the steps of injecting a diagnostic current into the wavelength tuning section of the DBR laser, measuring photo current in the gain section and correlating the photo current with an evaluation of the operating characteristics of the DBR laser diode.

Since the band gap of the phase control section 14 of a DBR laser 10 is typically larger than that of the gain section 16 of the DBR laser 10, the ASE light generated by the phase control section 14 is absorbed by the gain section 16, resulting in photo current at the gain section 16. This photo current can be used to measure ASE power in an all electrical approach that can be readily integrated into measurement systems and burn-in apparatuses, eliminating the need for photo detectors and associated electrical circuitry. FIG. 3 is an experimental plot illustrating the relationship of total ASE power and gain-section photo current $I_{GAIN}$ versus the square-root of phase-section injection current $I_\phi$ for a common DBR laser, at a gain section bias of 0 volts. As is illustrated in FIG. 3, there is excellent agreement between ASE power and gain section photo current $I_{GAIN}$ for phase-section injection current $I_\phi$ values below 80 mA. Similar results can be obtained with the use of other gain section bias voltages. Similar results can also be obtained using the DBR section 12 of the DBR laser 10 as the photo detector, although the DBR section has a band gap similar to the phase section and optical absorption is relatively weak, and plotting the photo current measured in the DBR section 12 versus the square root of the phase section injection current $I_{100}$. It is also contemplated that the concepts disclosed herein can be applied to two-section DBR laser diodes by injecting a diagnostic injection current into the wavelength tuning DBR section of the laser diode and measuring the photo current in the gain section of the diode.

It is noted that the currents measured for the gain section 16 and the phase control section 14 include the electrical leakage current between the wavelength-tuning section and the gain section. Where the wavelength tuning section is a phase control section, there is an electrical isolation resistance between the gain section and the phase section so the photo current at the gain section and the injection current at phase section can be obtained as follows:

$$I_{g,photo-current} = I_g - \frac{(V_g - V_p)}{R_i} \quad (6)$$

$$I_{p,injection-current} = I_p - \frac{(V_p - V_g)}{R_i} \quad (7)$$

where $V_g$ is the voltage provided to the gain section, $V_p$ is the voltage provided to the phase section, $I_g$ is the total gain-section current as seen by the electrical instrument, $I_p$ is the total phase-section current as seen by the electrical instrument, $I_{g,photo-current}$ is the photo current generated at the gain section, and $I_{p,injection-current}$ is the injected current at the phase section. These same calculations can be used to calculate the photo-currents for the Distributed Bragg Grating section by using appropriate substitutions of $I_{DBR}$ and $V_{BDR}$ for $I_p$ and $V_p$.

The present disclosure contemplates an alternative technique for measuring the degradation of a wavelength-tuning section of a DBR laser. According to the alternative technique, the voltage-current characteristics of the wavelength tuning section are used to characterize the operating characteristics of the laser. More specifically, the current responsible for producing carrier-induced wavelength shift and amplified spontaneous emission in the DBR laser can be referred to as radiative current. The remaining current can be referred to as non-radiative current, both of which are is illustrated as follows:

$$I = I_R \exp\left(\frac{e(V - R_S I)}{2KT}\right) + \sum_n I_n \exp\left(\frac{e(V - R_S I)}{nKT}\right) + I_{leakage} \quad (8)$$

where n is an integer not equal to 2, the first term in the equation represents the radiative current and the remaining terms in the equations represent non-radiative currents and the leakage current that bypasses the active region. When a semiconductor laser material suffers degradation, the amount of the non-radiative currents increases, effectively increasing the total current I. In the other words, if we compare the device before and after degradation, the voltage needed for a given current is reduced after degradation. Therefore, a time-dependent evolution of the voltage-current characteristics of a DBR laser can also be used to measure the degradation of a wavelength-tuning section by constructing a series of time-developed I-V curves, or creating some other representation of the evolution of the I-V characteristics of the wavelength tuning section of a DBR laser.

For the purposes of describing and defining the present invention, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of evaluating the operating characteristics of a DBR laser diode comprising a wavelength tuning section and a gain section, the method comprising:

injecting a diagnostic current into the wavelength tuning section of the DBR laser diode, wherein the diagnostic current generates amplified spontaneous emission of light in the wavelength tuning section and the bandgap of the wavelength tuning section is larger than that of the gain section such that the light emitted from the wavelength tuning section is absorbed by the gain section;

measuring photo current in the gain section generated by the light absorbed in the gain section; and correlating the photo current measured in the gain section with an evaluation of the operating characteristics of the DBR laser diode, wherein the measured photo current is correlated with a substandard operating characteristic or a certified operating characteristic depending upon the degree to which the measured photo current departs from a given photo current metric.

2. A method as claimed in claim 1 wherein the photo current in the gain section is measured as a function of time and is correlated with a certified or substandard operating characteristic by comparing the measured photo current with a given time sensitive photo current metric.

3. A method as claimed in claim 1 wherein the measured photo current is correlated with a certified or substandard operating characteristic by comparing the measured photo current to a predetermined laser degradation threshold.

4. A method as claimed in claim 1 wherein the photo current in the gain section is measured at a plurality of different times and is correlated with a certified or substandard operating characteristic by comparing the measured photo current with given photo current metrics at the plurality of different times.

5. A method as claimed in claim 1 wherein the photo current in the gain section is measured in-situ during burn-in testing of the laser diode.

6. A method as claimed in claim 1 wherein the photo current in the gain section is measured before and after burn-in testing of the laser diode.

7. A method of evaluating the operating characteristics of a DBR laser diode comprising a phase control section, a DBR section comprising a Bragg mirror, and a gain section, the method comprising:
   injecting a diagnostic current into the phase control section of the DBR laser diode, wherein the diagnostic current is sufficient to generate amplified spontaneous emission of light in the phase control section such that the light emitted from the phase control section is absorbed by the DBR section or the gain section of the DBR laser diode;
   measuring photo current in the DBR section or the gain section generated by the light absorbed therein; and
   correlating the photo current measured in the DBR section or the gain section with an evaluation of the operating characteristics of the DBR laser diode, wherein the measured photo current is correlated with a substandard operating characteristic or a certified operating characteristic depending upon the degree to which the measured photo current departs from a given photo current metric.

8. A method as claimed in claim 7 wherein the photo current is measured in the gain section of the DBR laser diode and the photo current measured in the gain section is correlated with an evaluation of the operating characteristics of the DBR laser diode.

9. A method as claimed in claim 7 wherein the photo current is measured in the DBR section of the DBR laser diode and the photo current measured in the DBR section is correlated with an evaluation of the operating characteristics of the DBR laser diode.

10. A method of evaluating the operating characteristics of a DBR laser diode comprising a wavelength tuning section and a gain section, the method comprising:
    injecting a diagnostic current into the wavelength tuning section of the DBR laser diode, wherein the diagnostic current comprises a radiative component that generates amplified spontaneous emission of light in the wavelength tuning section and a non-radiative component that increases with laser degradation;
    measuring increases in the non-radiative component of the diagnostic current by monitoring a voltage component of the diagnostic current injected into the wavelength tuning section of the DBR laser diode as a function of time; and
    correlating the voltage component of the diagnostic current with an evaluation of the operating characteristics of the DBR laser diode, wherein the voltage component is correlated with a substandard operating characteristic or a certified operating characteristic depending upon the degree to which the measured photo current departs from a given photo current metric.

11. A method as claimed in claim 10 wherein increases in the non-radiative component of the diagnostic current are measured by monitoring the voltage needed to maintain the diagnostic current at an approximately constant magnitude in the wavelength tuning section of the DBR laser diode as a function of time.

* * * * *